United States Patent [19]

Matsushima et al.

[11] Patent Number: 4,975,932
[45] Date of Patent: Dec. 4, 1990

[54] SHIFT REGISTER AND SHIFT REGISTER SYSTEM WITH CONTROLLABLE TRANSFER STAGES

[75] Inventors: Junko Matsushima, Kashihara; Tsuoshi Shiragasawa, Nenagawa; Hironori Akamatsu, Moriguchi, all of Japan

[73] Assignee: Matsushita Electric Industrial Co., Ltd., Osaka, Japan

[21] Appl. No.: 290,198

[22] Filed: Dec. 27, 1988

[30] Foreign Application Priority Data

Dec. 28, 1987 [JP] Japan .................. 62-331987

[51] Int. Cl.$^5$ .................. G11C 19/00; G11C 15/00
[52] U.S. Cl. ...................... 377/081; 377/70; 377/75; 377/78; 358/213.290
[58] Field of Search .......... 377/76, 77, 78, 79, 377/80, 81; 358/213.29

[56] References Cited

U.S. PATENT DOCUMENTS

| | | | |
|---|---|---|---|
| 3,258,696 | 6/1966 | Heymann | 377/81 |
| 3,764,824 | 10/1973 | Sangster | 377/79 |
| 4,016,511 | 4/1977 | Ramsey et al. | 377/76 |
| 4,418,418 | 11/1983 | Aoki | 377/79 |

Primary Examiner—John S. Heyman
Attorney, Agent, or Firm—Wenderoth, Lind & Ponack

[57] ABSTRACT

Through the step number control transfer gate activated by the step number control signal, the input data is sent into a specific transfer step of the shift register, and the data transferred from the specific transfer step is delivered from the output step. By selecting an arbitrary step number control transfer gate, the input transfer step is varied without changing the output step to change to an arbitrary data delay length. Therefore, only by increasing the driving capacity of the driver of the input data, a shift register short in delay time, small in increase of integration area, and low in power consumption will be obtained.

4 Claims, 12 Drawing Sheets

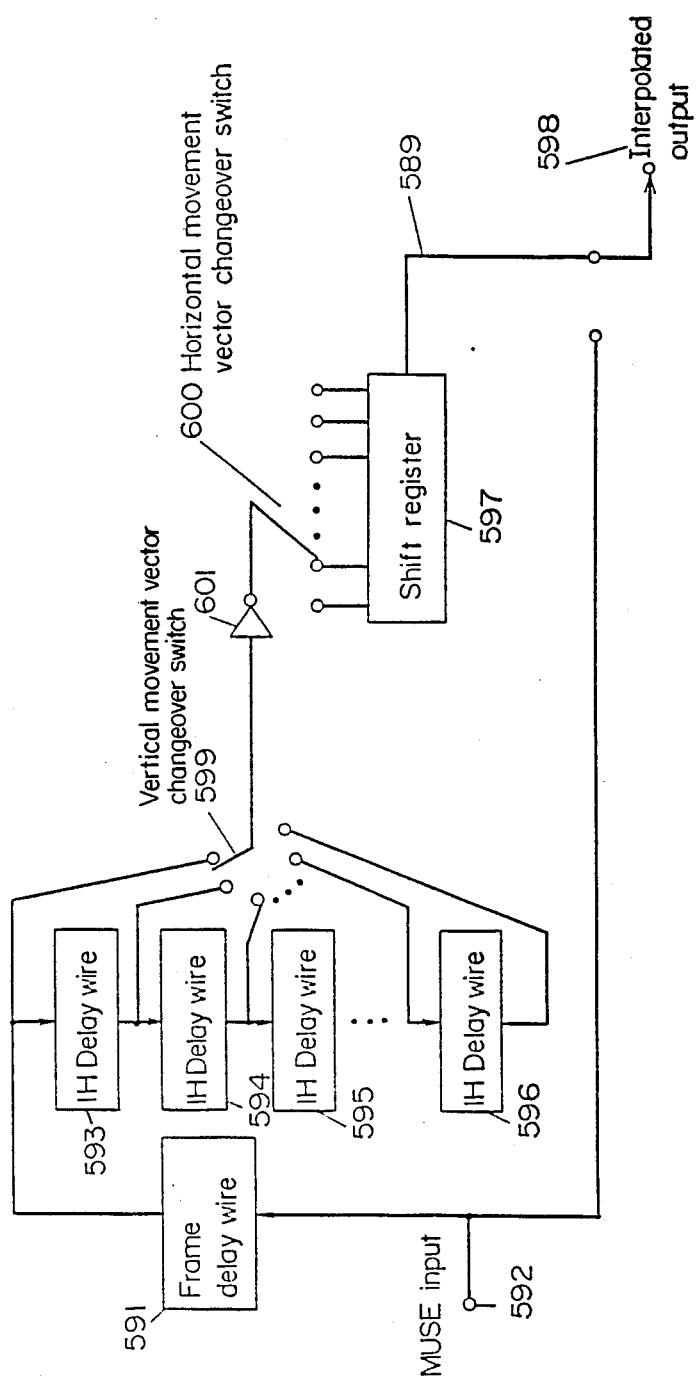
F I G. 7

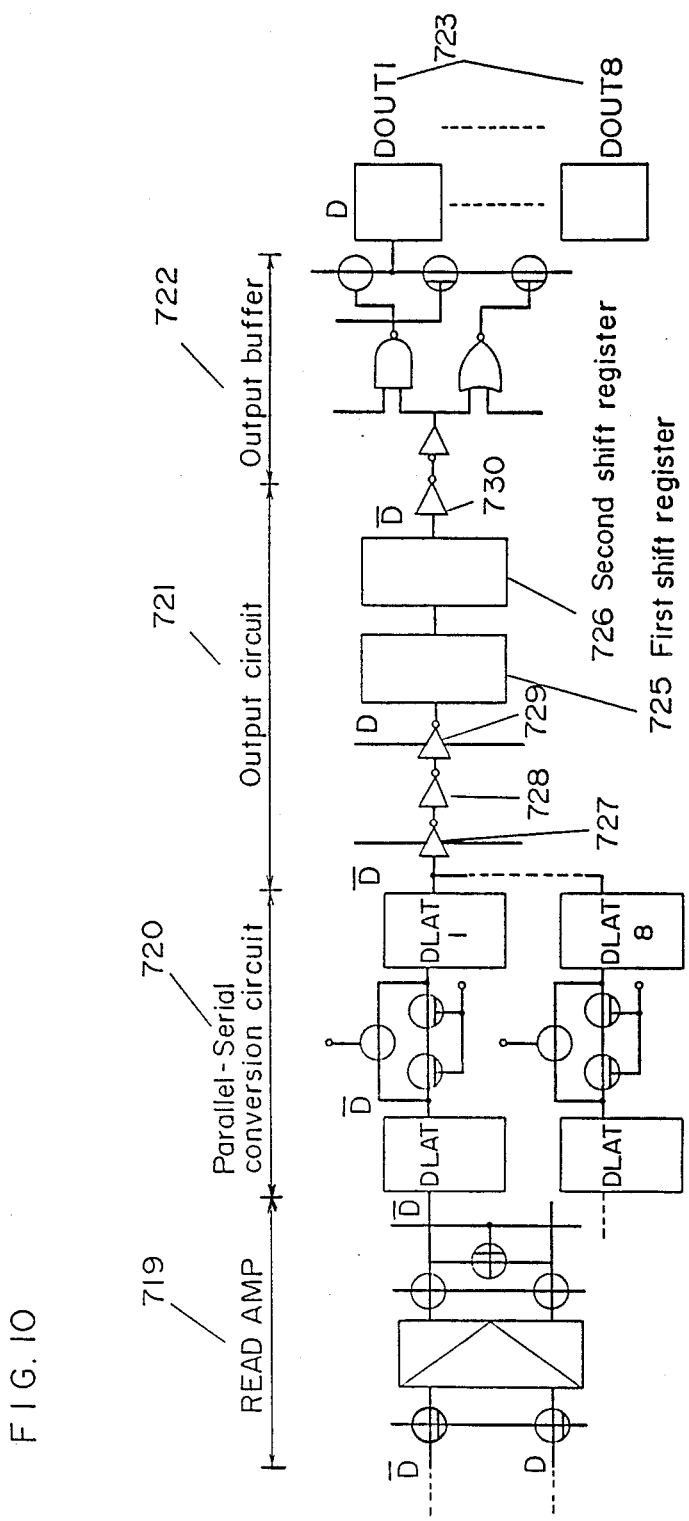
F I G. 10 ated by the inverter. As a result, the transfer gate 143 connected to the step number control signal wire 164 and inverted step number control signal wire 163 is opened, and the transfer data wire 174 and output data wire 190 are connected each other. Therefore, when the clock signal wire 101 is at an L level and the inverted clock signal wire 103 is at an H level, the transfer gate 111 is opened, and the data entering the shift register from the driver 104 through the input data wire 105 is sent into the transfer data wire 171, and the inverted signal of the input data is sent into the transfer data wire 172 through the inverter 121. Next, when the clock signal wire 101 is at an H level and the inverted clock signal wire 103 is at an L level, the transfer gate 112 is opened, and the inverted signal of the input data is sent into the transfer data wire 173, and the input data is sent into the transfer data wire 174 by way of the inverter 122, and then it is further sent into the output data wire 190 through the transfer gate 143. In this way, the input data is delivered through the transfer gate in the process of transfer which is turned on by the step number control signal.

SHIFT REGISTER AND SHIFT REGISTER SYSTEM WITH CONTROLLABLE TRANSFER STAGES

BACKGROUND OF THE INVENTION

This invention relates to a shift register circuit and a shift register system.

Along with the recent trend of high speed processing and digital processing of data, it comes to be necessary to provide the data with an arbitrary amount of delay or synchronize the external clocks in data transfer or data output. Besides, since high speed processing is required in video signals, parallel processing of data is often required. In such cases, a circuit for processing data of plural bits with a simultaneous delay is needed.

The shift register hitherto used in such cases is first explained below.

FIG. 1 shows a circuit diagram of a shift register which has been generally used so far. In FIG. 1, numeral 101 denotes a clock signal wire; element 102 is an inverter for inverting the clock; element 103 is an inverted clock signal wire for transmitting the clock inverted by the inverter 102; element 104 is a driver for feeding input data; element 105 is an input data wire, and element 107 is a step number control signal generation circuit for generating a step number control signal by receiving an external signal. Numerals 111, 113, and 115 denote transfer gates having the clock signal wire 101 connected to the gate of a P-channel transistor, and the inverted clock signal wire 102 connected to the gate of an N-channel transistor; elements 112, 114, 116 are transfer gates having the inverted clock signal wire 102 connected to the gate of the P-channel transistor gate, and the clock signal wire 101 connected to the gate of the N-channel transistor; elements 121 to 126 are inverters; elements 141, 143, and 145 are transfer gates controlled by the step number control signal and are connected to the input data wire 105, transfer data wires 174, 178, and output data wire 190; elements 151, 153, and 155 are inverters for inverting the step number control signal; elements 161, 163, and 165 are step number control signal wires for transmitting the inverted control signals from the inverters 151, 153, 155, respectively; elements 162, 164, 166 are step number control signal wires for sending the step number control signal from the step number control signal generation circuit 107; elements 171 to 182 are transfer data wires for transferring data in the shift register; and elements 190 is an output data wire.

In thus composed shift register shown in FIG. 1, when transferring data in a shift register consisting of n steps, if it is necessary to deliver the data which has been delayed for m periods of the clock (n greater than m), an external signal is received, and a step number control signal is sent from the step number control signal generation circuit 107. For example, when delivering data which has been delayed for 1 period of the clock, the step number control signal wire 164 becomes an H level, and the step number control signal wire 163 becomes an L level through the inverter. As a result, the transfer gate 143 connected to the step number control signal wire 164 and inverted step number control signal wire 163 is opened, and the transfer data wire 174 and output data wire 190 are connected each other.

In this composition, however, the input data is sent from the transfer gate 143 or 145 or 147 into the output data wire 190 through transfer data wires 174, 178, or 182. At this time, if the shift register is composed of plural steps, the capacity of the output data wire becomes large, and the delay time increases. In this composition, therefore, in order to increase the driving capacity of the transistor of the inverter in each transfer step of the shift register, it is necessary to increase the size of the transistor in the transfer step, and when integrated, the circuit area of the shift register becomes very large.

In particular, in the case of data parallel processing such as video signal processing, since shift registers in multiple steps are required, the increase of the circuit area and increase of current consumption were serious problems hitherto.

FIG. 2 is a block diagram of a data filter using a conventional shift register. This is reported by Ninomiya in "Transmission system "MUSE" of High-Vision television broadcasting using satellites," Nikkei Electronics, Nov. 2, 1987, No. 433, pp. 189–212. In FIG. 2, numeral 191 denotes a frame delay wire; element 192 is a MUSE data input terminal; elements 193 to 196 are delay wires for delays 1H data; element is a conventional shift register; element 198 is an interpolated data; element 199 is a vertical movement vector changeover switch, and 200 is a horizontal movement vector changeover switch.

The operation of thus composed system is explained below. The data enters from the MUSE input terminal 192, and a necessary number of 1H delay wires 193 to 196 are passed by the vertical motion vector changeover switch 199, and are delayed, and are entered into the shift register 197. The data entering the shift register 197. The data entering the shift register 197 is fed into the horizontal movement vector changeover switch 200, and arbitrary steps are passed, and are delivered from the output terminal 198.

In this composition, the transistor at each transfer step of the shift register 197 must deliver the output through the horizontal movement vector changeover switch 200, and the transistor size is forced to be larger, and the area of the integrated circuit of shift register 197 is increased. Furthermore, the power consumption of the system increases.

SUMMARY OF THE INVENTION

It is hence a primary object of this invention to present a shift register which has a short delay time, which is small size of constituent elements, and is capable of controlling the number of steps.

It is another object of this invention to present a shift register suited to integrated circuit as the increase of circuit area is restricted when integrating the semiconductors.

It is a different object of this invention to present a semiconductor integrated shift register favorable for reducing the power consumption and which actually has a small power consumption.

It is a still different object of this invention to present a shift register system which is excellent to be applied to a video memory or the like.

These and other objects of the invention are realized by a shift register which comprises:

a data transfer part connecting plural series of transfer steps to which input data is transferred, and delivering the delayed input data through an output part; and a plurality of step number control transfer gates whose opening and closing is controlled by step number control signals, and which are respectively connected to individual transfer steps, wherein specific step number control transfer gates selected by the step number control signals are opened, and the input data is fed into these specific transfer steps through the opened step number control transfer gates, and the input data is transferred from the specific transfer steps to the output part, and is delivered through the output part.

In this invention having the above configuration, since the input data is sent into the transfer data wire (transfer step) of the shift register through the step number control gate, only the driving capacity of the driver of the input data is raised, and it is not necessary to increase the transistor size of each transfer step, so that a shift register having a short delay time and capable of controlling the number of steps may be realized. Therefore, in this invention, it is not necessary to increase the size of the transistors composing each transfer step, and the increase of the circuit area may be restricted to a minimum limit.

BRIEF DESCRIPTION OF THE DRAWINGS

FIG. 7 is a block diagram of an example of data processing circuit using a shift register in accordance with a third embodiment of this invention;

FIG. 10 is a circuit block diagram from the reading circuit to the output pad of the video memory in accordance with the fifth embodiment of this invention;

DETAILED DESCRIPTION OF THE INVENTION

Figure 3:
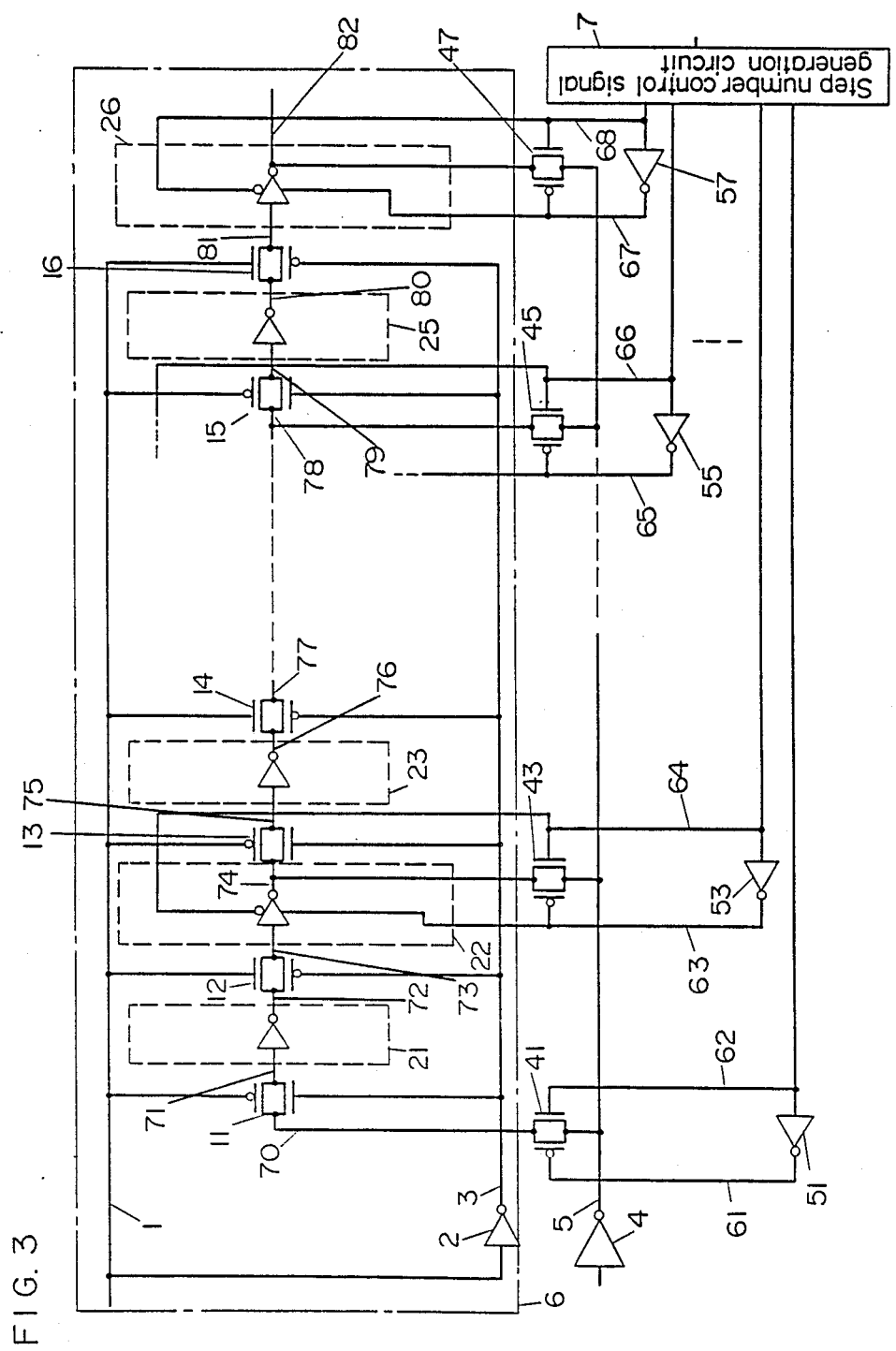
FIG. 3 is a logic diagram of a shift register in accordance with a first embodiment of this invention.

FIG. 3 shows a logic diagram of a shift register in accordance with the first embodiment of the prevent invention. In the shift register shown in FIG. 3, the data transfer step of data transfer part 6 is composed of transfer gates 11 to 16, inverters 21 to 26, and transfer data lines 70 to 81. The input data is fed into the transfer gates 41, 43, 45, and 47 through driver 4, and supplied into a specific data transfer step of the transfer part 6 through one of the transfer gates 41 to 47. The transferred data is delivered from the inverter 26 of the output step.

Thus, the shift register in FIG. 3 operates in such a manner that the input data is fed into an arbitrary transfer step of the transfer part 6 and is delivered from the same output step.

Describing FIG. 3 in details, numeral 1 denotes a clock signal wire; element 2 is an inverter for inverting the clock, 3 is an inverted clock signal wire for transmitting the clock inverted by the inverter 2; element 4 is a driver for feeding input data; element 5 is an input data wire, and element 7 is a step number control signal generation circuit for receiving external signals and for generating step number control signals. As the step number control signal generation circuit 7, a decoder or the like is used. Numerals 11 to 16 denote transfer gates for composing a transfer step by clock signal and inverted clock signal. The inverted clock signal wire 3 is connected to the gates of the P-channel transistors of transfer gates 11, 13, and 15, while a clock signal wire 1 is connected to the gate of the N-channel transistors of these gates. The inverted clock signal wire 3 is connected to the gates of the N-channel transistors of transfer gates 12, 14, and 16, while the clock signal wire 1 is connected to the gates of the P-channel transistors of these gates. Numerals 21, 23, and 25 denotes inverters, and elements 22 and 26 are clocked inverters (which are controlled by step number signals).

Numerals 41, 43, 45, and 47 denotes step number control transfer gates which are controlled by step number control signals and are connected to the input data wire 5 and transfer data wires 70, 74, 78, 82; elements 51, 53, 55, 57 are inverters for inverting the step number control signals; elements 61, 63, 65, and 67 are inverted step number control signal wires for transmitting the inverted step number control signals from the inverters 51, 53, 55, and 57, respectively; elements 62, 64, 66, and 68 are step number control signal wires for transmitting the step number control signals from the step number control signal generation circuit 7, and elements 70 to 81 are transfer data wires for transferring the data in the shift register. Numeral 82 denotes a transfer data output wire, which delivers the data passing through the specified number of transfer steps of the shift register.

Figure 4:
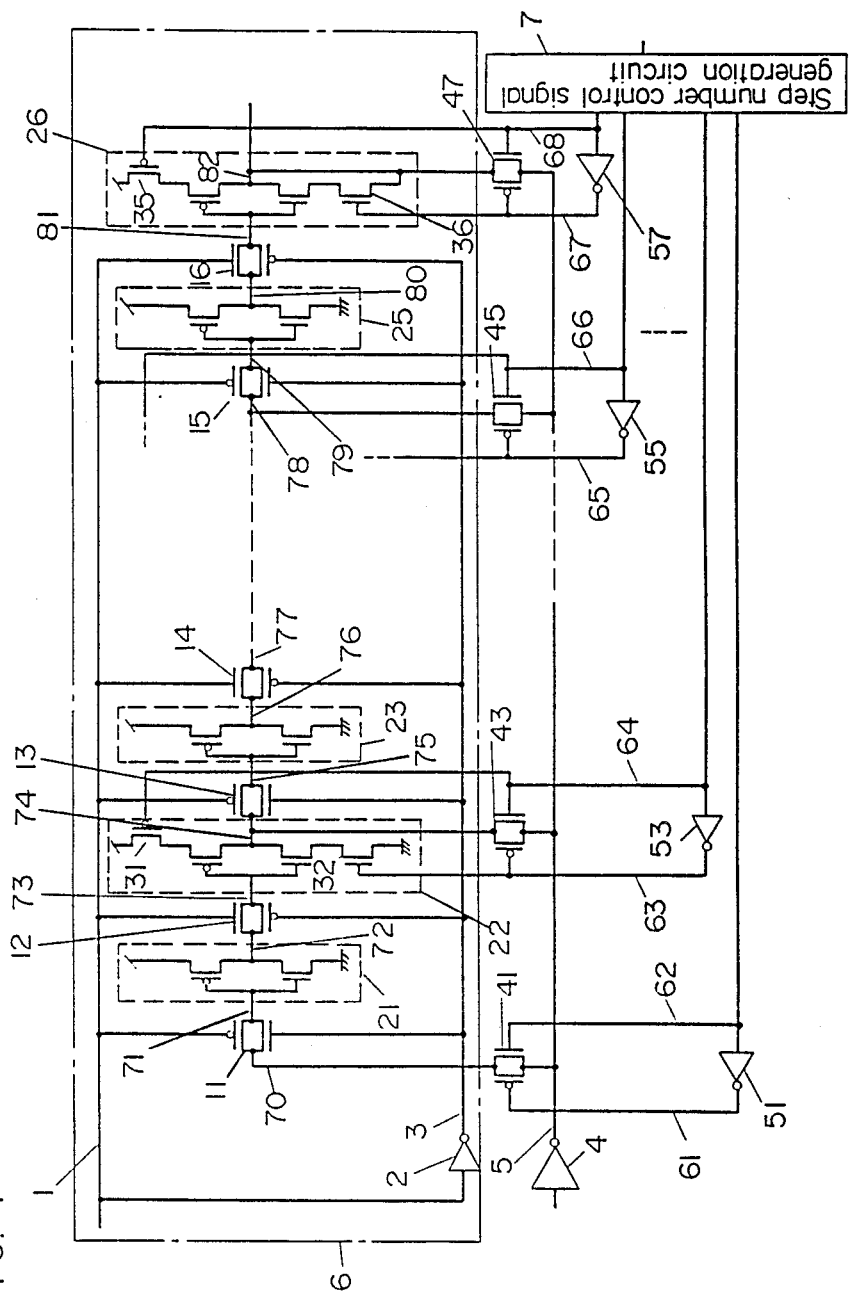
FIG. 4 is a circuit diagram of the shift register in accordance with the first embodiment of this invention.

FIG. 4 is an example of this embodiment in FIG. 3 presented as a circuit diagram of a shift register. According to FIG. 4, an example of the circuit of the first embodiment is illustrated, and the operation of this embodiment is explained herein. In FIG. 4, numerals 31, 32, 25, and 36 MOS transistors which work as transfer data stopping gates for controlling the clocked inverters 22 and 26 by step number control signals.

In the n-step shift register of this embodiment, for example, when transferring the data by causing a delay of clock (n−1) period, a step number control signal is sent from the step number control signal generation circuit 7 by receiving an external signal, and the step number control signal wire 64 becomes an H level, so that the inverted step number control signal wire 63 becomes an L level through the inverter 53. As a result, the step number control transfer gate 43, which is connected to the step number control signal wire 64 and the inverted step number control signals wire 63 is opened, and the input data sent from the driver 4 passes through the input data wire 5, and is sent to the transfer data wire 74 of the transfer step through the step number control transfer gate 43. The input data sent to the transfer data wire 74 is sent into the inverter 23 through the transfer gate 13 when the clock signal wire 1 becomes an H level and the inverted clock signal wire 3 becomes and L level, and the transfer gate 14 is opened when the clock signal wire 1 becomes a H level and the inverted clock signal wire 3 becomes L level, so that the data is sent into the transfer data wire 77. The data is afterwards transferred to the next steps successively. In this case, since the step number control signal wires 62, 66, and 68 are at an L level, and the inverted step number control signal wires 61, 65, and 67 are at an H level, the step number control transfer gates 41, 45, and 47 are closed. In the clocked inverter 26, since the step number control signal wires 68 is at an L level and the inverted step number control signal wire 67 is at an H level, the transfer data stop gates 35 and 36 are both in their ON state, and the clocked inverter 26 operates as an inverter. Therefore, the input data is delivered from the shift register after the clock of (n−1) period. Besides, since the step number control signal wire 64 is at an H level and the inverted step number control signal wire 63 is at an L level, the transfer data stop gates 31 and 32 are OFF, and the clocked inverter 22 does not operate. As a result, the transfer gates 11 and 12 and inverter 21 existing at the first step of the shift register are cut off, and are not related with the operation of the shift register.

On the other hand, when desired to deliver input data without a delay, by setting the step number control signal wire 68 to an H level through the step number control signal generation circuit 7, and setting the inverted step number control signal wire 67 to an L level through the inverter 57, and opening the step number control transfer gate 47, the input data wire 5 and the transfer data wire (output wire) 82 are connected to each other, so that the data is delivered directly. In consequence, the transfer data stop gates 35, and 36 are turned off, and the clocked inverter 26 does not operate. Therefore, the transfer steps up to the final transfer step are cut off from the transfer data output wire 82.

Thus, according to this embodiment, by installing step number control transfer gates 41, 43, 45, and 47 receiving step number control signals from the step number control signal generation circuit 7 as gate signals, connecting the input data wire 5, transfer data wires 70, 74, and 78, and transfer data output wire 82, and installing transfer data stop gates 31, 32, 35, and 36 which receives the step number control signals as gate signals, it is possible to enter the input data into a desired transfer step by the step number control signal, and vary the number of transfer steps of the shift register. In thus composed shift register, by increasing the driving capacity of the driver 4 for feeding the input data, when the input data is sent into the transfer data wire in a small delay time, the subsequent operation is same as in the usual shift register, and the delay time does not increase and it is also not necessary to increase the driving capacity of the transistors in the transfer step. Therefore, when fabricated into a semiconductor integrated circuit, the increase in the area is inhibited, and the delay time hardly increases, and a shift register capable of the controlling the number of steps can be realized.

In the conventional example of shift register, all steps are designed to transfer data and act, but in this embodiment, by installing transfer data stop gates, the transfer steps of the shift register located before the data input step are not related with data transfer, and it is not necessary to keep these parts in an operating state, so that the current consumption may be further decreased.

The following table compares the circuit area and current consumption between the prior art and this embodiment, in which the characteristics of the conventional shift register are supposed to be 100.

Figure 1:
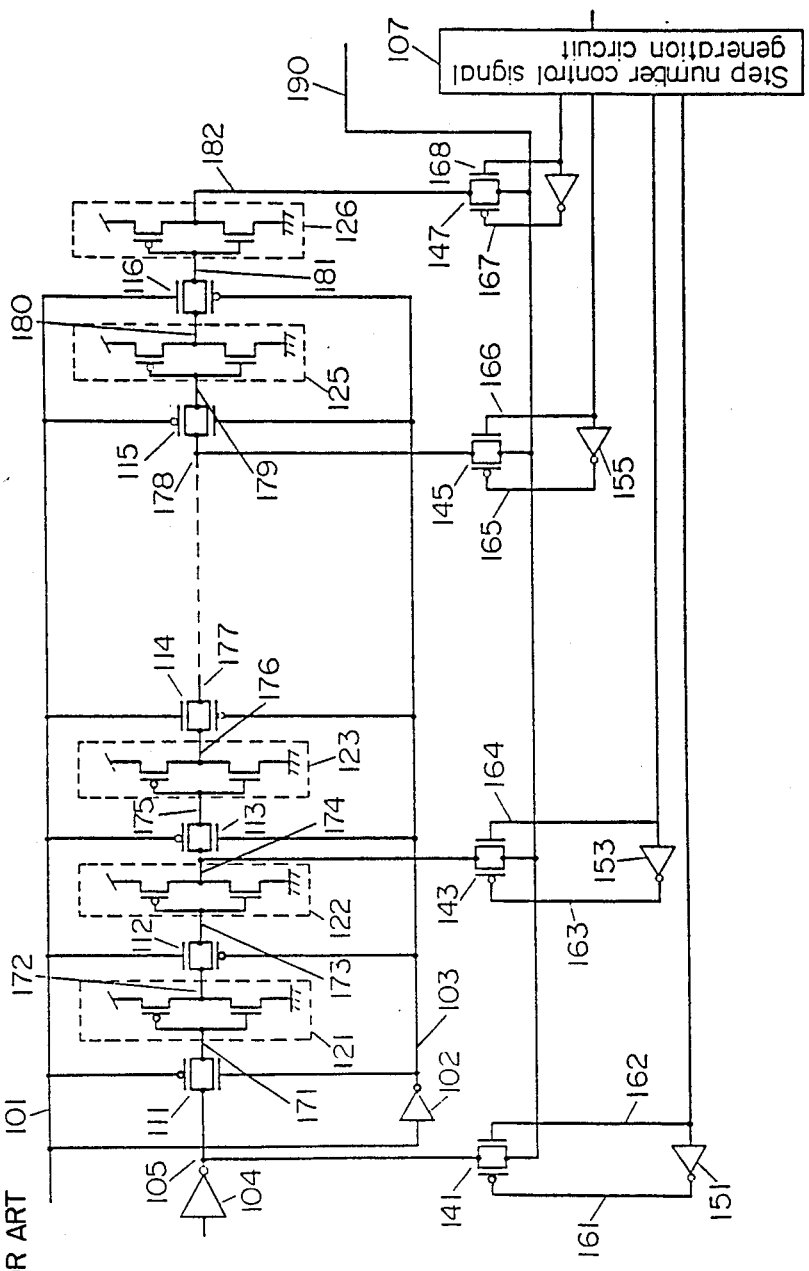
FIG. 1 is a circuit diagram of a prior art shift register.
Figure 2:
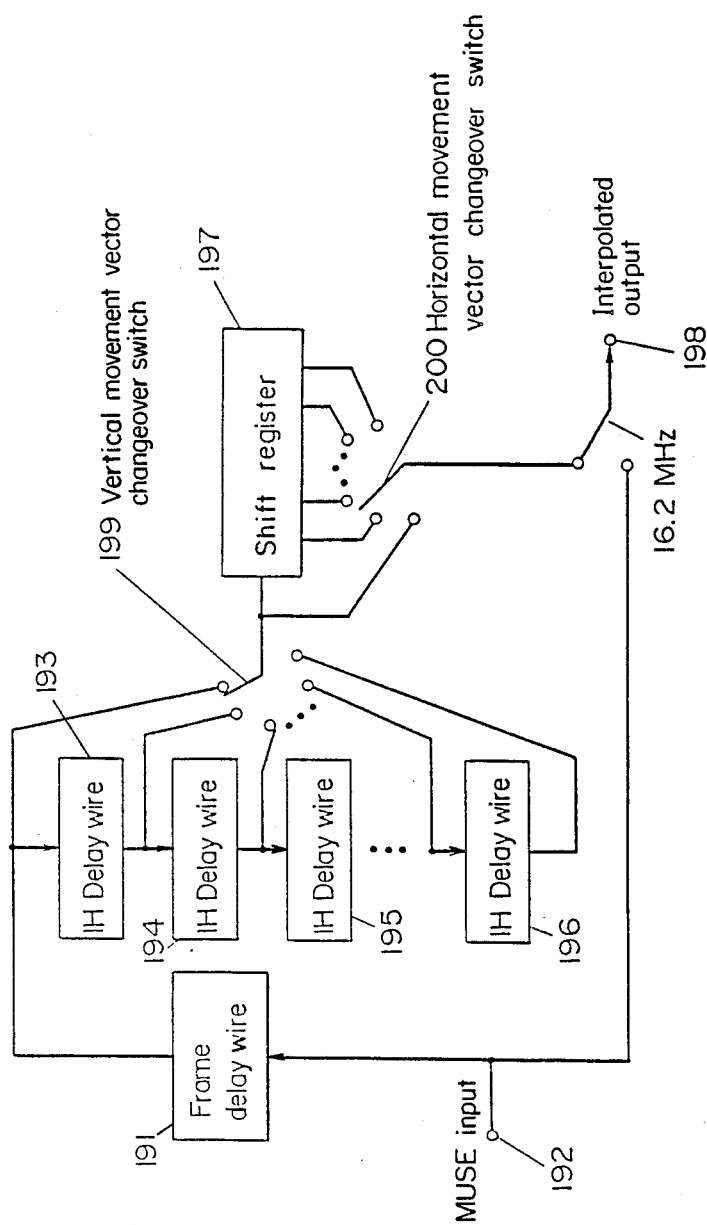
FIG. 2 is a block diagram of an example of video signal processing system using a conventional shift register.

|  | Circuit area (ratio) | Current consumption (ratio) |
| --- | --- | --- |
| Prior art | 100 (FIG. 1) | 100 (FIG. 1) |
| This embodiment | 80 | 40 to 80 |

Evidently, when integrated, the circuit area is small, and the current consumption is less, and a shift register capable of varying the register length can be presented.

Incidentally, in the first embodiment, it may be also possible to externally feed the step number control signal directly without installing the step number control signal generation circuit 7.

Figure 5:
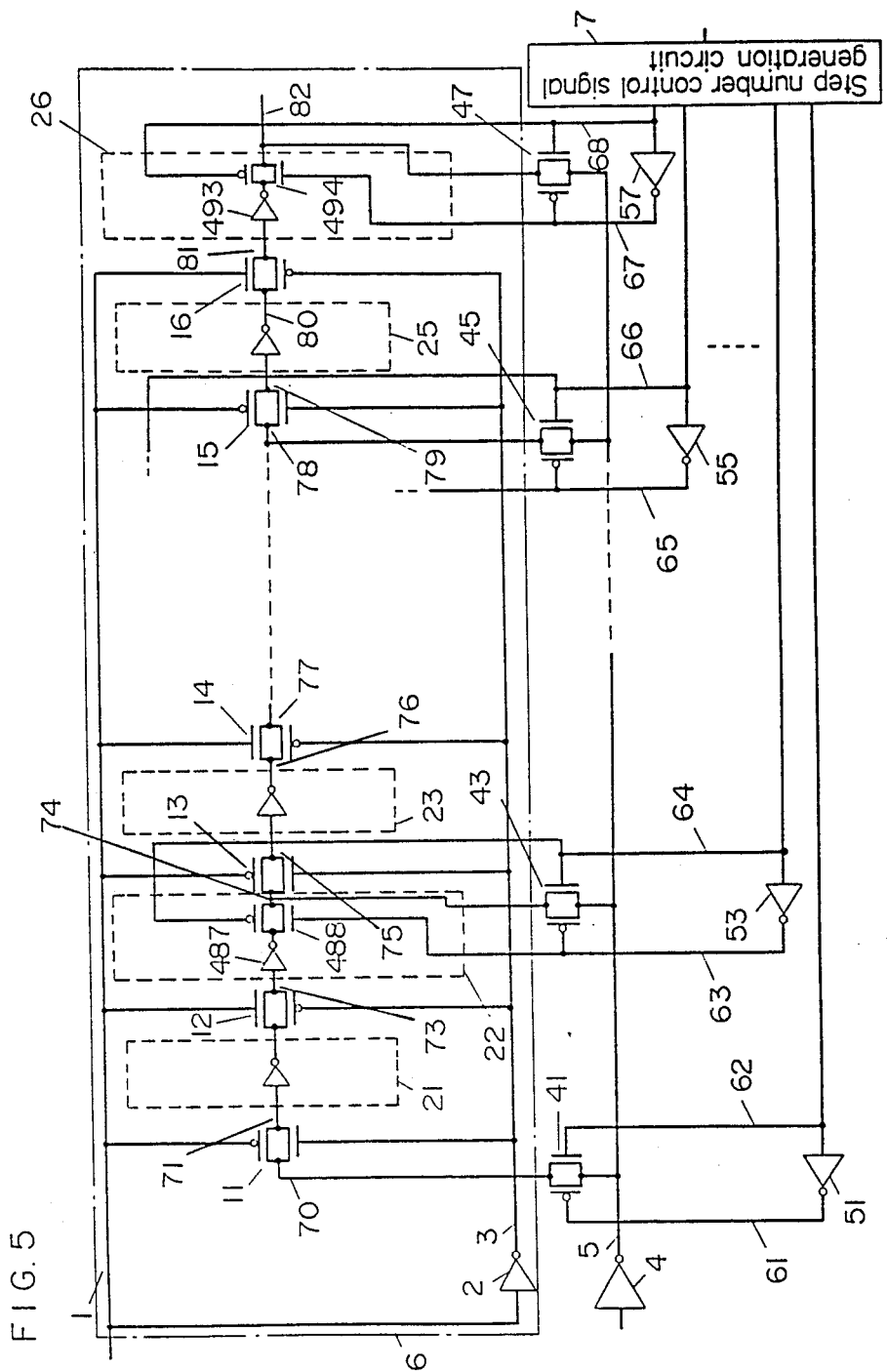
FIG. 5 is a circuit diagram of another shift register in accordance with the first embodiment of this invention.

In the first embodiment, moreover, the clocked inverters 22 and 26 may be also composed of inverters 487 and 493, and transfer gates 488 and 494, respectively, as shown in FIG. 5.

Figure 6:
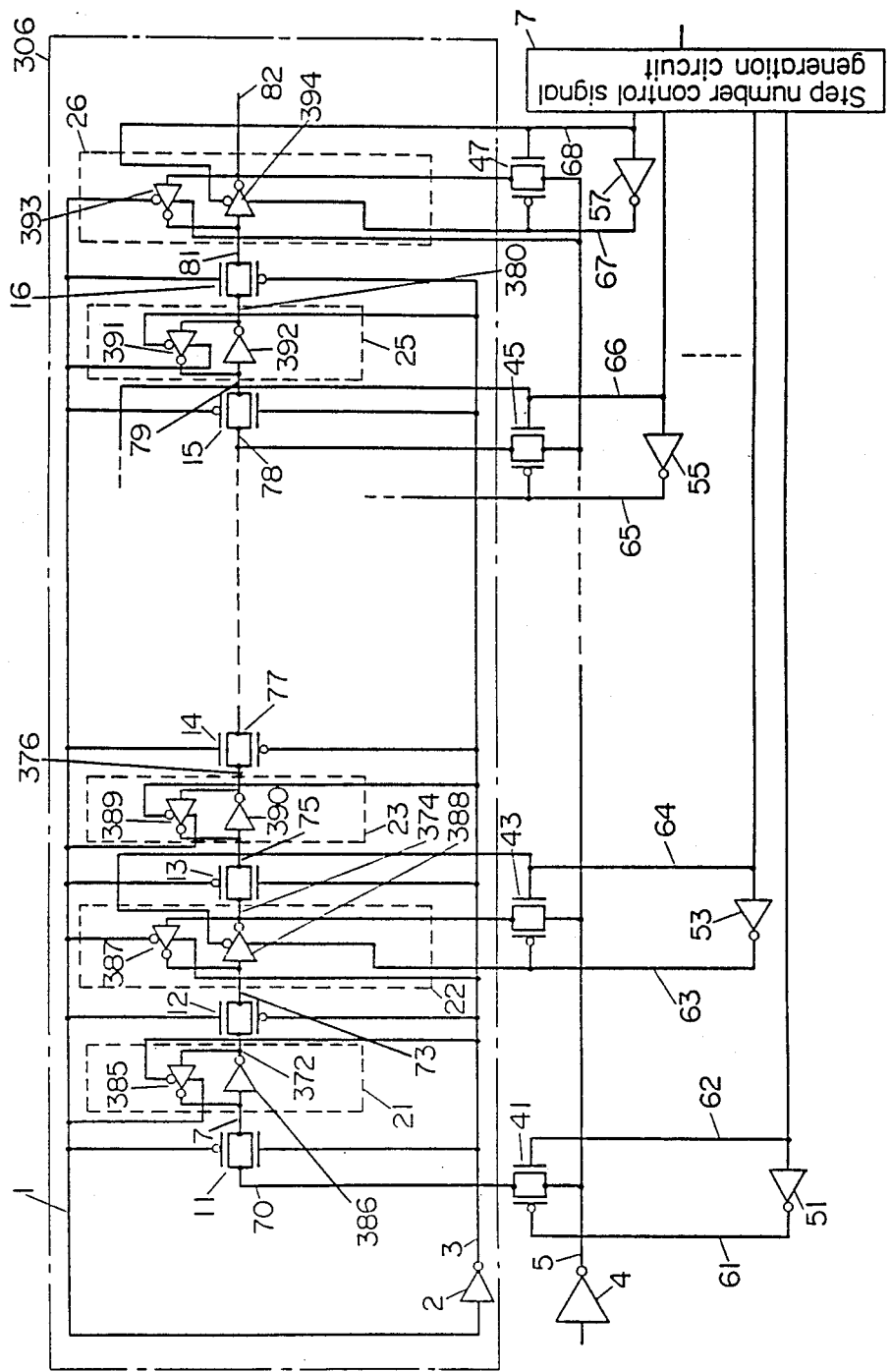
FIG. 6 is a logic diagram of a shift register in accordance with a second embodiment of this invention.

FIG. 6 shows a logic diagram of a shift register in accordance with the second embodiment of the present invention.

The structure is similar to that in FIG. 4, except that shown a latch circuit is composed of inverters 386, 390 and 392 and clocked inverters 385, 389, 319 controlled by the clock signal and the inverted clock signal, and inverters 22 and 26 are also formed as latch circuits composed of clocked interters 388 and 394 which are controlled by the step number control signal, the inverted step number control signal, and clocked inverters 387 and 393 are controlled by the clock signal and the inverted clock signal.

The operation of thus composed second embodiment is described below.

In the n-step shift register of this embodiment, for example, when transferring the data by causing a delay of (n−1) clock periods, a step number control signal is sent from the step number control signal generation circuit 7 by receiving an external signal, and the step number control signal wire 64 becomes an H level, so that the inverted step number control signal wire 63 becomes an L level through the inverter 53. As a result, the step number control transfer gate 43 connected to the step number control signal wire 64 and the inverted step number control signal wire 63 is opened, and the input data sent from the driver 4 passes through the input data wire 5, and is sent to the transfer data wire 374 of the transfer step through the step number control transfer gate 43. The input data sent to the transfer data wire 374 is sent into the inverter 390 through the transfer gate 13 when the clock signal wire 1 becomes an L level and the inverted clock signal wire 3 becomes an H level; next, the clock signal wire 1 becomes an H level and the inverted clock signal wire 3 becomes an L level, so that the data is sent into the transfer data wire 77. While the clock signal wire 1 is at an H level and the inverted clock signal wire 3 is at an L level, the clocked inverter 389 operates to make up a latch circuit with inverter 390, so that the data is retained. The data is sequentially transferred to the subsequent steps. In this case, since the step number control signal wires 62, 66 and 68 are all at an L level and the inverted step number control signal wires 61, 65, and 67 are all at an H level, the step number control transfer gates 41, 45, and 47 are closed. Since the step number control signal wire 68 connected to the clocked inverter 394 is at an L level and the inverted step number control signal wire 67 is at an H level, the clocked inverter 394 operates as an inverter. Therefore, the input data is delivered from the shift register after $n-1$ clock peroids. On the other hand, since the step number control signal wire 64 is at an H level and the inverted step number control signal wire 63 is at an L level, the clocked inverter 388 does not operate. Accordingly, at the first step of the shift register, the transfer gates 11 and 12, and the inverter 21 are cut off, and they are not related with the operation of the shift register.

By contrast, when it is necessary to deliver input data without any delay by the clock, the step number control signal wire 68 is set to an H level by the step number control signal generation circuit 7, and the inverted step number control signal wire 67 is set to an L level through the inverter 57, and the step number control transfer gate 47 is opened, so that the input data wire 5 and transfer data wire 82 are connected to each other, thereby delivering the data directly. At this time, the clocked inverter 394 does not operate. Hence, the final step is cut off from the transfer data wire 82.

Thus, according to this embodiment, by installing the step number control transfer gates 41, 43, 45, and 47 for receiving the step number control signal from the step number control signal generation circuit 7 as a gate signal, and connecting the input data wire 5, transfer data wires 70, 74, and 78 and transfer data output wire 82, and installing clocked inverters 388 and 394, the number of steps of the shift register can be varied by the step number control signal.

Or, as shown in FIG. 6, by composing the inverters 21, 22, 23, 25, and 26 as latch circuits which are controlled by the clock signal and the inverted clock signal, the data can be retained regardless of the time at each step of transfer, so that a longer delay time than in the first embodiment may be set, and the shift register maybe composed so as to set in an arbitrary number of steps.

FIG. 7 is a block diagram of a data processing circuit using a shift register in accordance with the third embodiment of the present invention.

In this embodiment, the shift register of this invention is applied in the data filter disclosed by Ninomiya in "Transmission system "MUSE" of High-Vision television broadcasting using satellites," Nikkei Electronics, Nov. 2, 1987, No. 433, pp. 189-212.

In FIG. 7, numeral 589 denotes a transfer data output wire; element 591 is a frame delay wire; element 592 is a MUSE data input terminal; elements 593 to 596 are delay wires for the portion of 1H data; element 597 is a shift register, 598 is a data output terminal; element 599 is a vertical movement vector changeover switch; element 600 is a horizontal movement vector changeover switch, and element 601 is an input data driver of the shift register.

The operation of the thus composed fourth embodiment is discussed below.

The data enters from the MUSE terminal 592, and the 1H delay wires 593 to 596 of a necessary delay amount are passed by the vertical movement vector changeover switch 599 so as to be delayed as required. Next, through the shift register input data driver 601, specific transfer steps of the shift register 597 are passed by the horizontal movement vector changeover switch 600, and the data is delivered from the output terminal 598 through the transfer data output wire 589.

In this way, according to this embodiment, it is only enough to increase the driving capacity of the shift register input data driver 601. Therefore, by using the shift register 597 for giving a desired delay as the shift register of this invention, the circuit system for delaying the data may be integrated by reducing the area and saving the power consumption.

Figure 8:
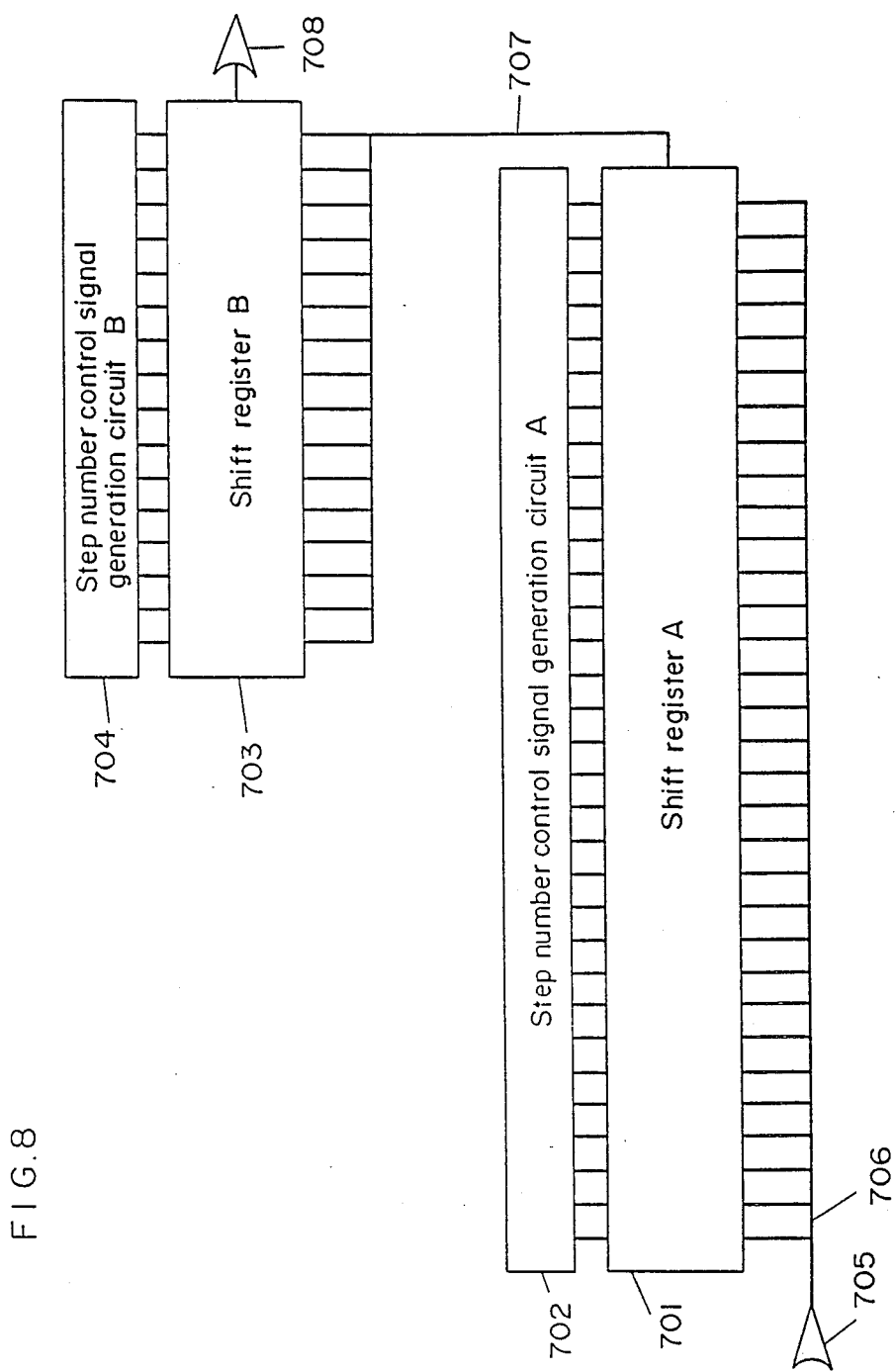
FIG. 8 is a block diagram of a data delay circuit using a shift register in accordance with a fourth embodiment of this invention.

FIG. 8 is a block diagram of a data delay circuit composed of a plurality of shift registers of the present invention in accordance with its fourth embodiment, and this is an example used in the system shown in FIG. 10 later. In FIG. 8, numeral 701 denotes a shift register A; element 702 is a step number control signal generation circuit A; element 703 is a shift register B (for example, for correction of horizontal movement); element 704 is a step number control signal generation circuit B; element 705 is input data; element 706 is a shift register A input data wire, 707 is a shift register B input data wire, and element 708 is a shift register output terminal.

The operation of the shift register of this embodiment composed in this way is described below.

The data input step of the shift register 701 is selected by the step number control signal generation circuit 702. Through the input data wire 706 of the shift register 701, the input data 705 is fed into the selected input step of the shift register 701, and is sequentially transferred through the shift register 701, and is sent into the input data wire 707 of the shift register 703.

By the step number control signal generation circuit 704, the input step of the shift register 703 is set, and the data is sent by the input data wire 707 of the shift register 703.

The data entering the shift register 703 is sequentially transferred, passing an arbitrary number of steps, and is delivered from the shift register output terminal 708.

Thus, according to this embodiment, by connecting the shift register 701 and shift register 703, the data delayed by the shift register 701 may be delivered from the shift register 703 by providing with a different delay time than in the shift register 701. In other words, by using a plurality of shift registers, the delay amount can be controlled independently by the shift register 701 and shift register 703, and it is also possible to deliver the data in the total of two delay quantities. Accordingly, an arithmetic circuit for calculating the sum of the delay given by the shift register 701 and the delay by the shift register 703 is not needed, and the two delay systems can be controlled independently.

In this embodiment, if the physical distance between the shift register 701 and shift register 703 is close on an integrated circuit, and the driving capacity of the output driver at the final step of the shift register 701 is sufficient, the data input driver of the shift register 701 is sufficient, the data input driver of the shift register 703 may not be necessarily required. Thus, when a plurality of shift registers are used, the circuit area and current consumption are particularly increased, and the shift register of this invention is effective.

Figure 9:
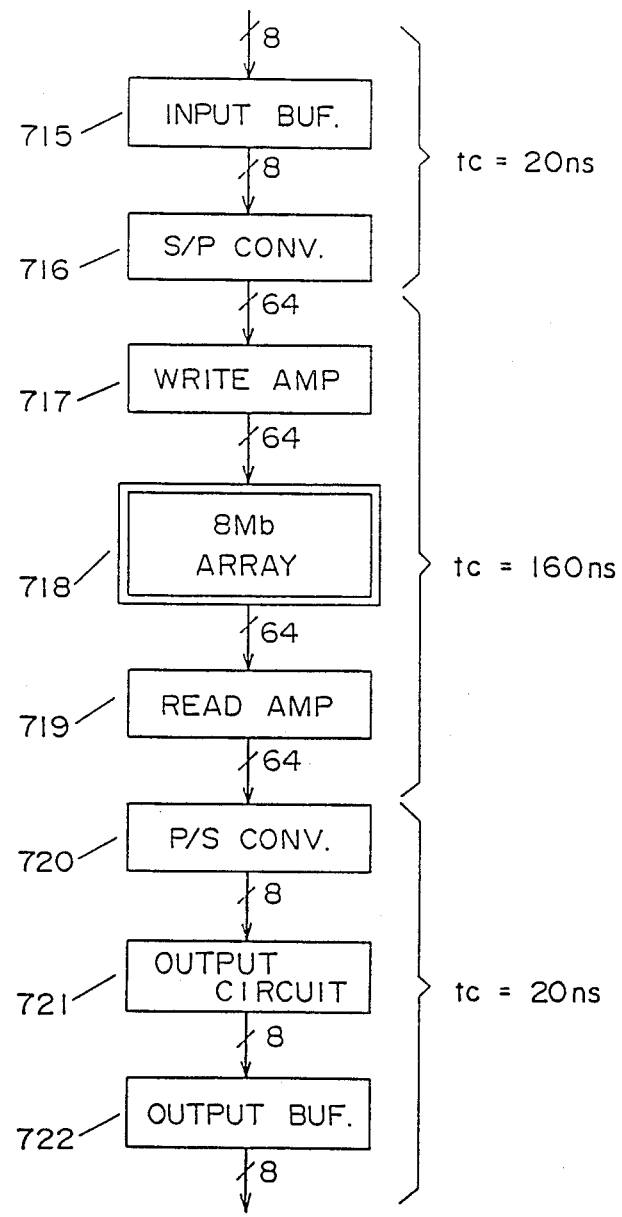
FIG. 9 is a data flow chart of a video memory having a shift register in accordance with a fifth embodiment of this invention.

FIG. 9 is a data flow chart of a video semiconductor memory having a shift register of this invention in accordance with the fifth embodiment.

In FIG. 9, numeral 715 denotes an input buffer; element 716 is a serial-parallel conversion buffer; element 716 is a writing circuit, 718 is a cell array, 719 is a reading circuit; element 720 is a parallel-serial conversion circuit; element 721 is an output circuit, and element 722 is an output buffer.

The operation of the video memory in the thus composed embodiment is explained below.

Eight bits of data entering in parallel are respectively converted into 8-bit parallel data, that is, in a total of 64 bits by the serial-parallel conversion circuit 716 through the input buffer 715, and written into the cell array 718 through the writing circuit 717.

When the data is written into the cell array 718, all 64 bits are simultaneously read out by the reading circuit 719. Then, in the parallel-serial conversion circuit 720, each 8-bit portion is converted into serial data, and the 8-bit parallel data is sent into the output circuit 721. Thus, the 8-bit parallel data is delivered from the output buffer 722.

FIG. 10 is a circuit block diagram after the reading circuit 719 of the video memory in the same embodiment.

In FIG. 10, numeral 719 denotes a reading circuit; element 720 is a parallel-serial conversion circuit; element 721 is an output circuit; element 722 is an output buffer; element 723 is an output pad; element 725 is a first shift register, and element 726 is a second shift register. Numerals 727 to 730 denote inverters. The video memory of this embodiment has eight circuits of FIG. 10 disposed in parallel.

Figure 11:
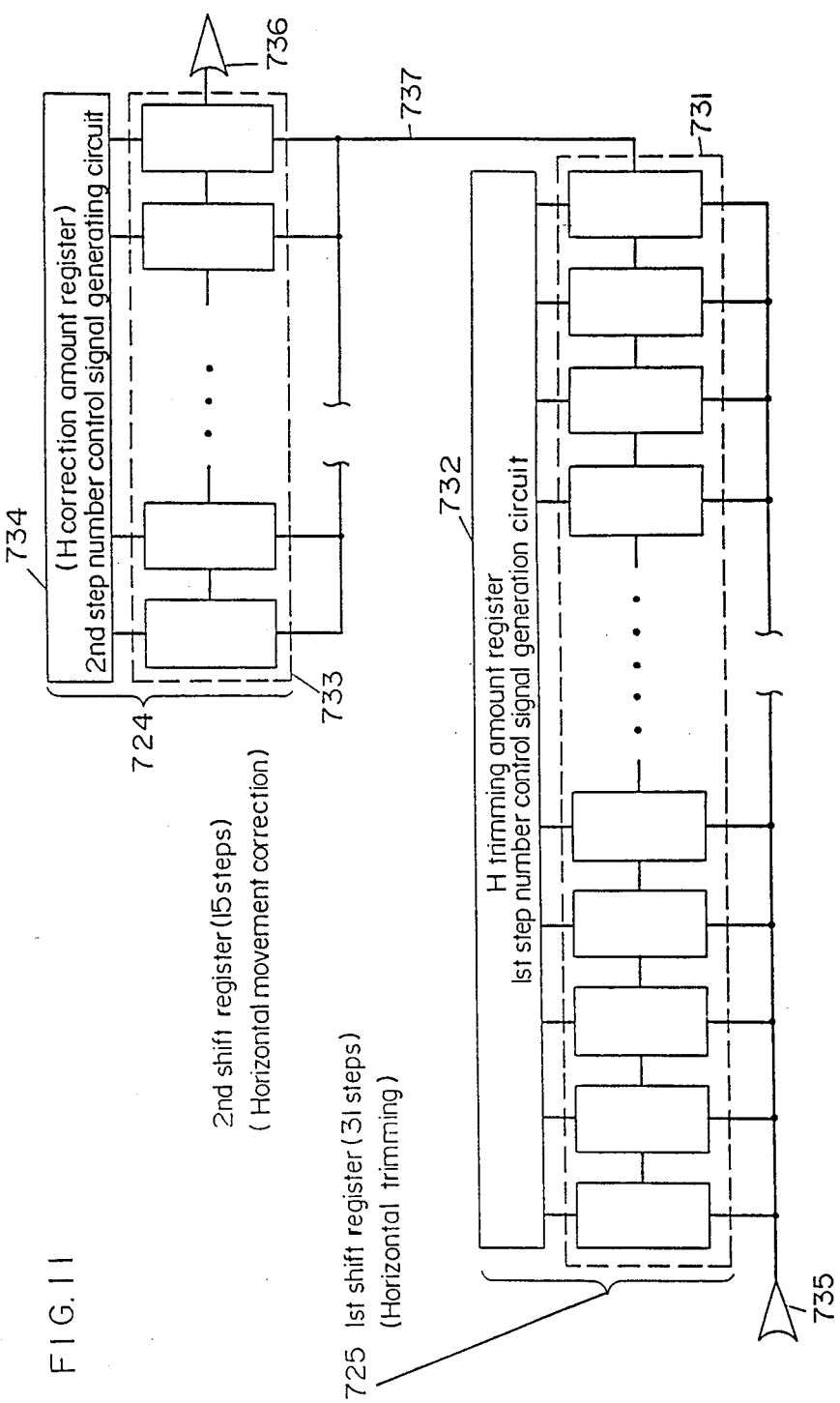
FIG. 11 is a block diagram of the shift register of the video memory in accordance with the fifth embodiment of this invention.

FIG. 11 is a block diagram of the shift register having a video memory in accordance with the fifth embodiment of the present invention, applying the structure shown in FIG. 8. FIG. 11 shows a part of FIG. 10. In FIG. 11, numeral 725 denotes a first shift register; element 726 is a second shift register; element 731 is a first shift register transfer part; 732 is a first step number control signal generation circuit; element 733 is a second shift register data transfer part; element 734 is a second step number control signal generation circuit; element 735 is a shift register input terminal; element 736 is a shift register output terminal, and element 737 is a second shift register data input wire.

The operation of the thus composed fifth embodiment is explained below.

The data being read out by the reading circuit 719 is converted into 8-bit serial data in the parallel-serial conversion circuit 720 composed of latch circuit. The converted data is sent into the output circuit 721, passes through the inverters 727 to 729, and is fed into the first shift register 725 through the shift register input terminal 735. By the first step number control signal generation circuit, a number of steps corresponding to the horizontal trimming amoung will be specified, and the data passes through the first shift register data transfer part 731 by the becessary number of steps to be delayed, and is fed into the second shift register data input wire 737. At the second shift register 736, by the second step number control signal generation circuit 734, the number of steps corresponding to the horizontal movement correction amount is specified, and the data passes through the second shift register data transfer part 733 by the necessary number of steps, and is delivered from the shift register output terminal 736. The data being delayed while passing through the first shift register 725 and second shift register 726 is sent into the output buffer 722 through the inverter 730. Then the 8-bit parallel data is delivered from the output pad 723.

Thus, in this embodiment, eight first shift registers and another eight second shift registers are required in the video memory.

Therefore, in the case of a video memory requiring multiple shift registers, it is effective to reduce the circuit area by the shift register of this invention.

In this invention, moreover, it is possible to reduce the current consumption as compared with the conventional shift register.

Figure 12:
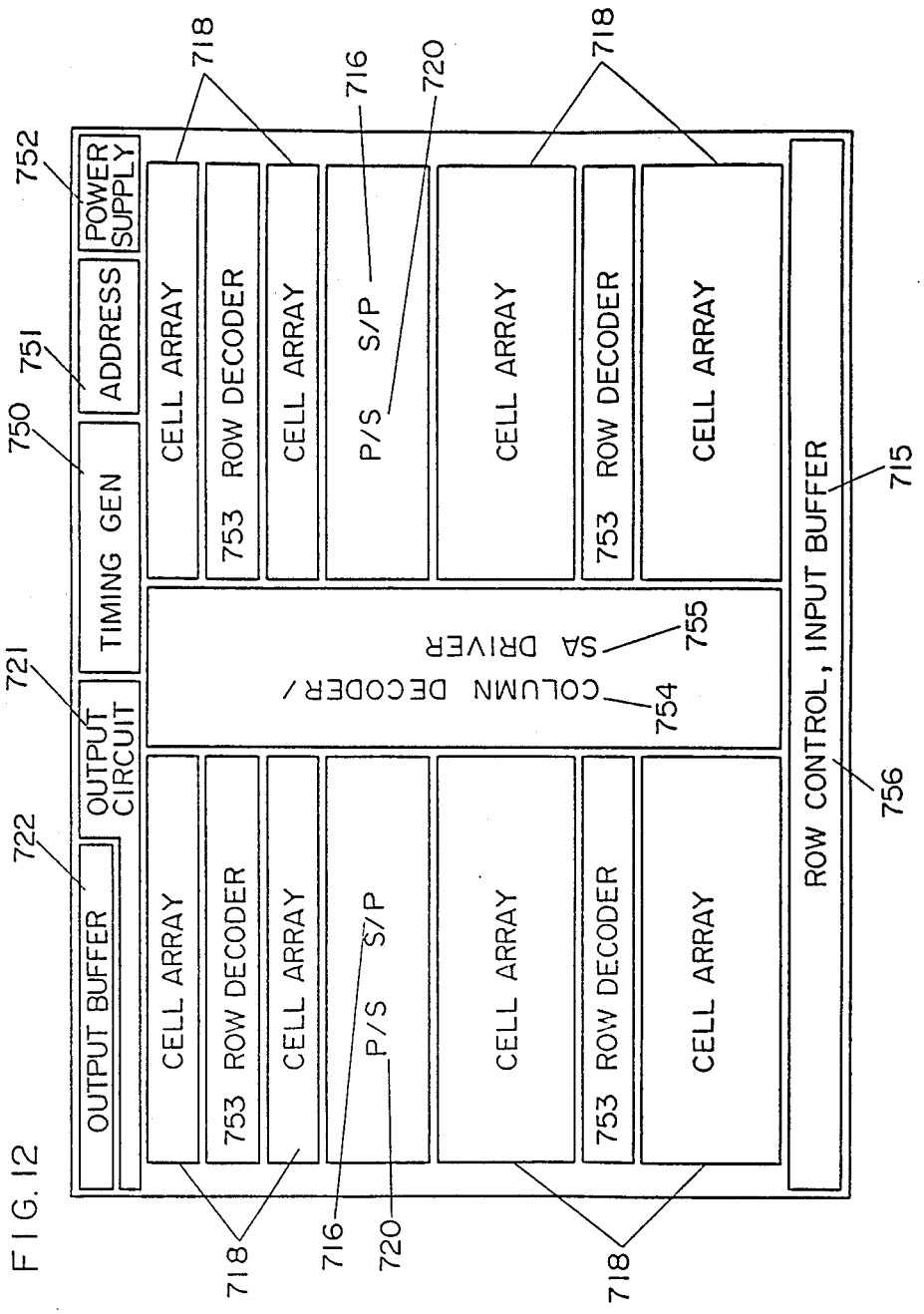
FIG. 12 is a chip configuration diagram of the video memory in accordance with the fifth embodiment of this invention.

FIG. 12 is a chip configuration diagram of a video memory in accordance with the fifth embodiment.

In FIG. 12, numeral 715 denotes an input buffer; element 716 is a serial-parallel conversion circuit; element 718 is a cell array; element 720 is a parallel-serial conversion circuit; element 721 is an output circuit, and element 722 is an output buffer.

Numeral 750 denotes a timing generation circuit; element 751 is an address generation circuit; element 752 is a power supply circuit; element 753 is a row decoder; element 754 is a column decoder; element 755 is a sense amplifier control circuit, and element 756 is a row control circuit.

Since the fifth embodiment requires 16 shift registers for delay, the shift register of this invention is very effective.

The video memory is required to operate at a small current consumption and in a small circuit area. On the other hand, since data of plural bits is processed in parallel, multiple circuits for delay must be provided.

Accordingly, as in this embodiment, it is possible to realize parallel data delay circuits at small power consumption and in narrow circuit area, in a video memory, by using the shift registers of this invention.

We claim:
1. A shift register comprising:
   a data transfer portion comprising plural series of transfer steps in which transfer stop gates are respectively located at output portions of individual transfer steps;
   a control circuit for controlling at least one step number control signal; and
   a plurality of step number control transfer gates being controlled in opening and closing by said at least one step number control signal, and respectively connected to said individual transfer steps of said data transfer portions;
   wherein a specific step number control transfer gate is opened by at least one step number control signal from said control circuit and a transfer stop gate disposed in a front transfer step of a specific transfer step connected to said opened specific step number control transfer gate is closed by said step number control signal simultaneously;
   whereby input data is entered into said specific transfer step, and output data from said front transfer step of said specific transfer step is stopped, so that said input data is transferred from said specific transfer step to an output portion of said data transfer portion and is delivered from said output portion of said data transfer part with a delayed time.

2. A shift register according to claim 1, wherein a driver means is provided for feeding input data into said specific step number control transfer gate.

3. A shift register system comprising first and second shift registers, each of said shift registers comprising:
- a data transfer portion comprising plural series of transfer steps in which transfer stop gates are respectively located at output portions of individual transfer steps;
- a control circuit for controlling at least one step number control signal; and
- a plurality of step number control transfer gates being controlled in opening and closing by said at least one step number control signal, and respectively connected to said individual transfer steps of said data transfer portions;
- wherein a specific step number control transfer gate is opened by at least one step number control signal from said control circuit and a transfer stop gate disposed in a front transfer step of a specific transfer step connected to said opened specific step number control transfer gate is closed by said step number control signal simultaneously;
- whereby input data is entered into said specific transfer step, and output data from said front transfer step of said specific transfer step is stopped, so that said input data is transferred from said specific transfer step to an output portion of said data transfer portion and is delivered from said output portion of said data transfer part with a delayed time;
- wherein output data from said first shift register is fed to said second shift register as input data, whereby said input data is output from an output portion of said second shift register with an accumlated delay time equal to the sum of said delayed times of said first and second shift registers.

4. A shift register system according to claim 3, wherein said input data comprises a picture signal and wherein corrected data of said picture signal is obtained as an output data of said shift register system with said delayed time of said first shift register corresponding to a horizontal trimming and a delayed time of said second shift register corresponding to a horizontal movement correction.

* * * * *